(12) United States Patent
Rehnström et al.

(10) Patent No.: US 12,424,727 B2
(45) Date of Patent: Sep. 23, 2025

(54) PRINTED CIRCUIT BOARD, AN ANTENNA ARRANGEMENT AND A COMMUNICATION DEVICE

(71) Applicant: Telefonaktiebolaget LM Ericsson (publ), Stockholm (SE)

(72) Inventors: Mats Rehnström, Sollentuna (SE); Håkan Lindblom, Bromma (SE); Tomas Håkansson, Nynäshamn (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 108 days.

(21) Appl. No.: 18/272,268

(22) PCT Filed: Mar. 30, 2021

(86) PCT No.: PCT/SE2021/050284
§ 371 (c)(1),
(2) Date: Jul. 13, 2023

(87) PCT Pub. No.: WO2022/211684
PCT Pub. Date: Oct. 6, 2022

(65) Prior Publication Data
US 2024/0072410 A1    Feb. 29, 2024

(51) Int. Cl.
*H01Q 1/22*        (2006.01)
*H01Q 1/52*        (2006.01)
*H01Q 5/342*       (2015.01)

(52) U.S. Cl.
CPC .............. *H01Q 1/22* (2013.01); *H01Q 1/521* (2013.01); *H01Q 5/342* (2015.01)

(58) Field of Classification Search
CPC ........... H01Q 1/22; H01Q 1/42; H01Q 1/521; H01Q 5/342; H01Q 5/357; H01Q 9/42;
(Continued)

(56) References Cited

U.S. PATENT DOCUMENTS 6,639,555 B1 * 10/2003 Kane ..................... H01Q 1/36
343/815
2007/0176843 A1    8/2007 Qureshi et al.
(Continued)

FOREIGN PATENT DOCUMENTS

EP        3657599 A1    5/2020
JP        2006148959 A   6/2006
(Continued)

OTHER PUBLICATIONS

EPO Communication with Partial Supplementary European Search Report dated Dec. 3, 2024 for Patent Application No. 21935349.7, consisting of 39 pages.
(Continued)

*Primary Examiner* — Daniel Munoz
(74) *Attorney, Agent, or Firm* — Weisberg I.P. Law, P.A.

(57) ABSTRACT

The present invention relates to a printed circuit board, PCB, with at least one integrated antenna element configured to transmit and/or receive radio frequency, RF, signals. Each of the at least one antenna element is configured to be connected to RF circuitry, and the at least one antenna element is embedded in the PCB. The present invention also relates to an antenna arrangement and a communication device for wireless communication comprising a PCB with at least one embedded antenna element.

13 Claims, 9 Drawing Sheets

(58) Field of Classification Search
CPC .... H01Q 21/28; H05K 1/0228; H05K 1/2201; H05K 1/09263; H05K 1/09672; H05K 1/097; H05K 1/09709
See application file for complete search history.

(56) References Cited

U.S. PATENT DOCUMENTS

| | | |
|---|---|---|
| 2011/0025576 A1 | 2/2011 | Mao et al. |
| 2012/0133561 A1 | 5/2012 | Konanur et al. |
| 2013/0147664 A1 | 6/2013 | Lin |
| 2014/0145883 A1 | 5/2014 | Baks et al. |
| 2015/0022418 A1 | 1/2015 | Azuma |
| 2019/0006734 A1* | 1/2019 | Svendsen ............... H01Q 5/314 |

FOREIGN PATENT DOCUMENTS

| | | |
|---|---|---|
| KR | 20100020757 A | 2/2010 |
| WO | 2017186913 A1 | 11/2017 |

OTHER PUBLICATIONS

Gu, et al., "Packaging and Antenna Integration for Silicon-Based Millimeter-Wave Phased Arrays: 5G and Beyond," IEEE Journal of Microwaves, vol. 1, Issue 1, Jan. 2021, pp. 123-134.
International Search Report and Written Opinion for International Patent Application No. PCT/SE2021/050284, mailed Dec. 9, 2021, 11 pages.

\* cited by examiner

PRINTED CIRCUIT BOARD, AN ANTENNA ARRANGEMENT AND A COMMUNICATION DEVICE

This application is a 35 U.S.C. § 371 national phase filing of International Application No. PCT/SE2021/050284, filed Mar. 30, 2021, the disclosure of which is incorporated herein by reference in its entirety.

TECHNICAL FIELD

The invention relates to the field of printed circuit boards, PCBs, with at least one integrated antenna element. More particularly the invention pertains to protecting the antenna element(s) from the surrounding environment by embedding the antenna element(s) in the PCB

BACKGROUND

There are various ways of implementing antennas in a communication device and a common denominator is that the antenna must be exposed to the surrounding environment in order to function properly and operate as an antenna. The antenna can be protected from the surrounding—and sometimes—hostile environment by using a plastic or rubber encapsulation which would allow the radio signal to pass through the plastic or rubber encapsulation but in most cases the electronics connected to the antenna would require an additional inner metallic shielding to fulfil electromagnetic compatibility, EMC, requirements. However, high volume, high-end radio equipment placed outside (or that is in need of a rugged, robust design that can operate in harsh environments and in a wide temperature range) needs to be carefully designed with emphasis on functionality, safety, serviceability, producibility and of course, cost.

Thus, there are various successful ways to implement antennas that provides excellent performance regarding range, ruggedness etc.

Drawbacks with existing solutions are:
1. The cost of implementing an external antenna
2. The cost of assembly time
3. The space needed on the PCB for implementing an electromechanical antenna solution.
4. The mechanical issues such as IP-classification, through hole mounting etc., that arises when a discrete electromechanical antenna is implemented.

SUMMARY

An object of the present disclosure is to provide a PCB which seeks to mitigate, alleviate, or eliminate one or more of the above-identified deficiencies in the art and disadvantages singly or in any combination and to provide an antenna arrangement with one or more environmentally protected antenna elements.

This object is obtained by a printed circuit board, PCB, with at least one integrated antenna element configured to transmit and/or receive radio frequency, RF, signals. Each of the at least one antenna element is configured to be connected to RF circuitry, and the at least one antenna element is embedded in the PCB.

This object is also obtained by an antenna arrangement for wireless communication configured to transmit and/or receive radio frequency, RF, signals, wherein the antenna arrangement comprises: a printed circuit board, PCB, with at least one integrated antenna element configured to transmit and/or receive radio frequency, RF, signals. Each of the at least one antenna element is configured to be connected to RF circuitry, and the at least one antenna element is embedded in the PCB; a first structural part and a second structural part. A first side of the PCB is mounted to the first structural part and a second side, opposite to the first side, of the PCB is mounted to the second structural part to expose a part of the PCB with the at least one antenna element.

This object is also obtained by a communication device for wireless communication comprising RF circuitry configured to transmit and/or receive radio frequency, RF, signals, and the antenna arrangement comprising a printed circuit board, PCB, with at least one integrated antenna element configured to transmit and/or receive radio frequency, RF, signals. Each of the at least one antenna element is connected to RF circuitry, and the at least one antenna element is embedded in the PCB; a first structural part and a second structural part. A first side of the PCB is mounted to the first structural part and a second side, opposite to the first side, of the PCB is mounted to the second structural part to expose a part of the PCB with the at least one antenna element and to form a casing with at least a first cavity. The RF circuitry is configured to be arranged within the first cavity and electrically connected to the at least one antenna element embedded in the PCB.

An advantage is that the mechanical implementation is simplified, since it doesn't require any connectors to contact an external antenna. Furthermore, the at least one antenna element is not exposed to environmental aspects, such as wind, moisture and snow that would affect the performance of the antenna arrangement, since it is embedded inside the PCB, which serves as protection to the above mentioned environmental aspects.

Another advantage is that it is very simple to implement a number of highly integrated half wave antennas ($\lambda/2$) and/or quarter wave antennas ($\lambda/4$).

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Figure 1:
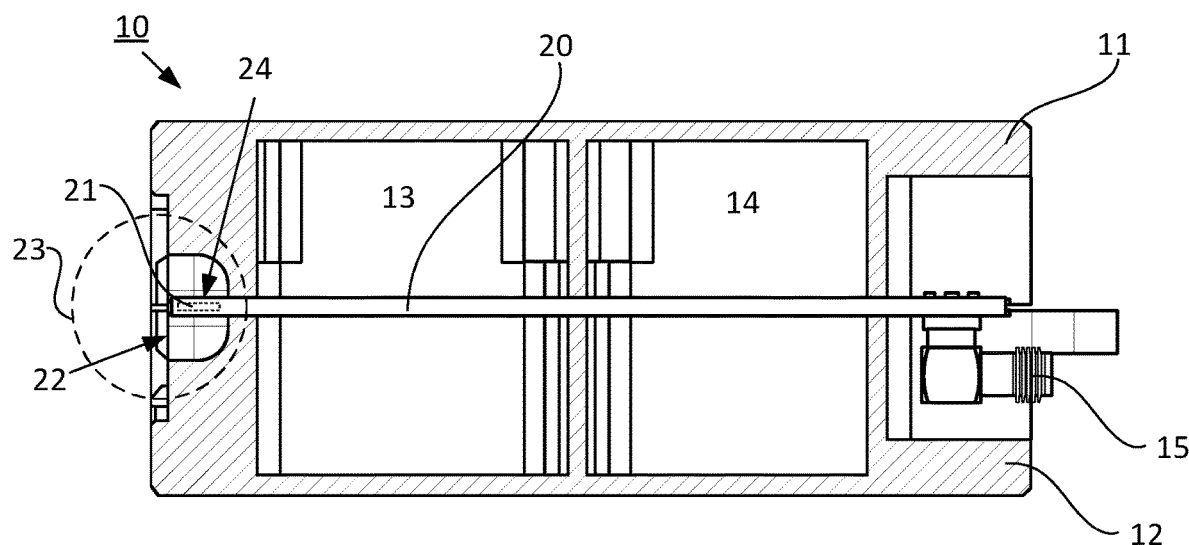
FIG. 1 is a cross-sectional view of a wireless communication device provided with a PCB with one or more embedded antenna elements.

Aspects of the present disclosure will be described more fully hereinafter with reference to the accompanying drawings. The apparatus disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Some of the example embodiments presented herein are directed towards a printed circuit board, PCB, with at least one embedded antenna element. As part of the development of the example embodiments presented herein, a problem will first be identified and discussed.

Wireless communication devices requires at least one antenna element for communication purposes. Prior art solutions requires an external antenna, which in turn will increase both cost and assembly time. Furthermore, a connector for the external antenna will require space on the PCB, and the implementation of an external antenna will also introduce mechanical issues related to IP classification.

In order to reduce assembly time, component cost, as well as costs regarding update and maintenance of wireless communication devices, antenna solutions which requires no external electromechanical antennas are disclosed. The antenna solutions can be used in any electronic application where a highly integrated antenna solution, which requires no external components is needed and which also provides a possibility to create an antenna lobe which limits unwanted spread of the signal.

Different aspects of the invention will be disclosed in connection with the accompanying drawings, and one feature of the example embodiments is that at least one antenna element is embedded within the PCB in order to protect it from environmental factors, such as moisture, wind, ice etc.

Another feature of the example embodiments is that when an antenna element is embedded within the PCB a shield may be created around the antenna wire interconnecting the antenna element with RF circuitry. Furthermore, a distance to the surrounding shielding mechanics may also be created.

In a MIMO implementation, two antenna elements are laterally arranged, i.e. routed 180 degrees away from each other in a horizontal plane, thereby requiring a wide antenna opening. In an alternative MIMO implementation, the two antenna elements are overlapping, i.e. on top of each other but crossing at a 90 degree angle in a normal direction of the horizontal plane, thereby only requiring a narrow antenna opening.

The shape and the implementation of structural parts when mounted to the PCB will create a mechanical solution that is intended to create a directed antenna lobe.

Apart from the above mentioned advantage of creating an antenna solution that does not require any external components and connectors, there are other benefits:

It is very simple to implement a number of highly integrated half wave antenna elements ($\lambda/2$) and/or quarter wave antenna elements ($\lambda/4$). The number of antenna elements to be implemented can for instance be 1, 2 or 4 antenna elements.

The proposed solution simplifies the mechanical implementation, since it doesn't require a solution that involves "through-hole" mechanics and the antenna solution as such, is never exposed to environmental aspects, such as wind, moisture and snow that would affect the performance of the solution, since it is embedded inside the exposed part of the PCB when mounted to the structural parts of the wireless communication device, which serves as protection to the above mentioned environmental aspects.

The proposed solution is extremely cost effective since it only uses the already existing mechanics and PCB.

Normally, it is required that a Wi-Fi antenna is omnidirectional and that the solution used provides long range capabilities whereas one aspect of the proposed solution has properties of an directional aerial antenna with limited long range capabilities, which serves the purpose of preventing improper eaves dropping and interference due to the characteristics of the antenna lobe.

FIG. 1 is a cross-sectional view of a wireless communication device 10 provided with a printed circuit board, PCB, 20 with one or more embedded antenna elements 21. The dashed circle 23 indicates an antenna arrangement comprising the one or more embedded antenna elements 21 in the PCB 20 and an antenna cavity 22 created in the mechanical structure around the exposed part 24 of the PCB 20.

The PCB 20 with its embedded antenna elements 21 is placed between a first structural part 11, i.e. an upper half of the mechanical structure, and a second structural part 12, i.e. a lower half of the mechanical structure which also serves as shielding. Recesses in the upper 11 and lower 12 halves of the mechanical structure are implemented to create the antenna cavity 22 to achieve a desired effect needed to form a lobe.

The exposed part 24 of the PCB containing the one or more antenna elements 21 as well as the elongated antenna cavity 22 are both part of the existing mechanics, hence requiring very little additional space. Another design detail worth mentioning is that if the radio solution chosen is made from discrete components, this solution offers a possibility to implement a space effective dedicated "radio cavity" denoted 13 in order to prevent disturbances from other parts of the design. However, if the radio design consists of a shielded module, the radio solution might not need a dedicated mechanical cavity. A baseband cavity 14 is also provided to house digital and DC/DC components. Electronic circuitry within the radio cavity 13 and the baseband cavity 14 may be mounted to the PCB 20 and also connected to an RF connector 15.

Figure 2:
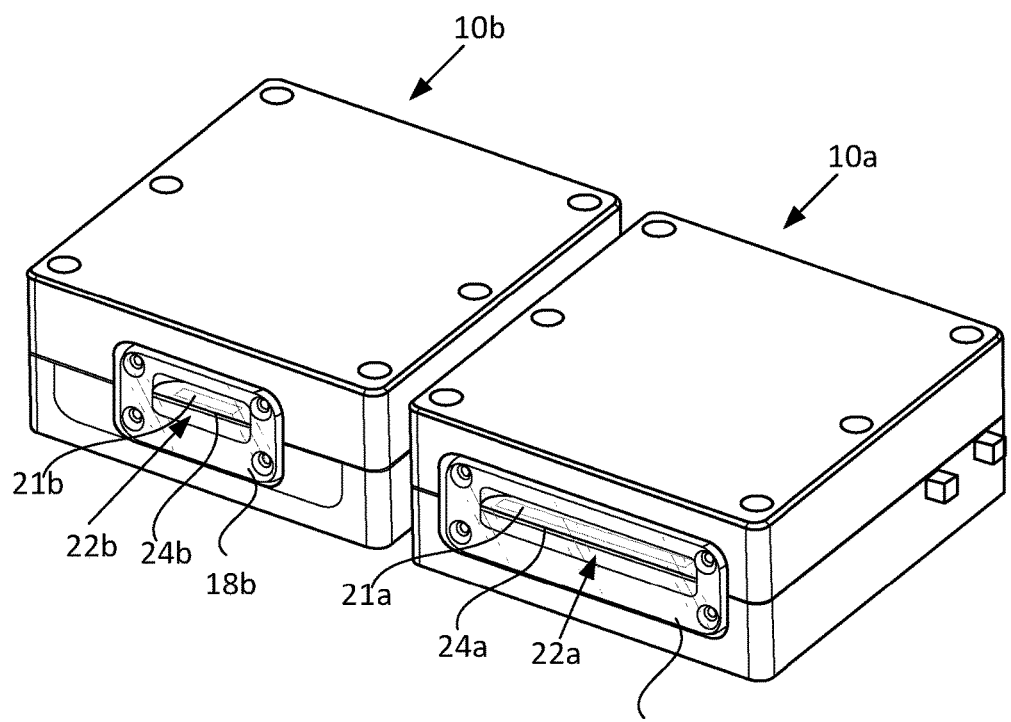
FIG. 2 illustrates two example embodiments of a wireless communication device with alternative antenna configurations.

FIG. 2 illustrates two example embodiments of a wireless communication device 10a, 10b with alternative antenna configurations 21a, 21b in the respective exposed parts 24a and 24b of the PCBs, a "wide antenna solution" in the wireless communication device 10a as well as a "narrow antenna solution" in the wireless communication device 10b. The antenna solutions implemented supports both a "quarter wave" (λ/4) antenna elements for transmitting/receiving carrier frequencies at e.g. 2.5 GHz as well as a "half wave" (λ/2) antenna elements used for transmitting/receiving frequencies at e.g. 5 GHz.

The mechanical antenna solution i.e. the dimensions of the antenna cavity 22a, 22b, have to be designed with respect to the carrier frequency used.

A protective cover 18a and 18b is in these embodiments placed over the respective exposed part 24a and 24b to further enhance resistance from the surrounding environment. The protective cover is made from a non-conductive material to minimize the influence on the radio waves transmitted/received by the embedded antenna elements within the respective PCB.

Figure 3:
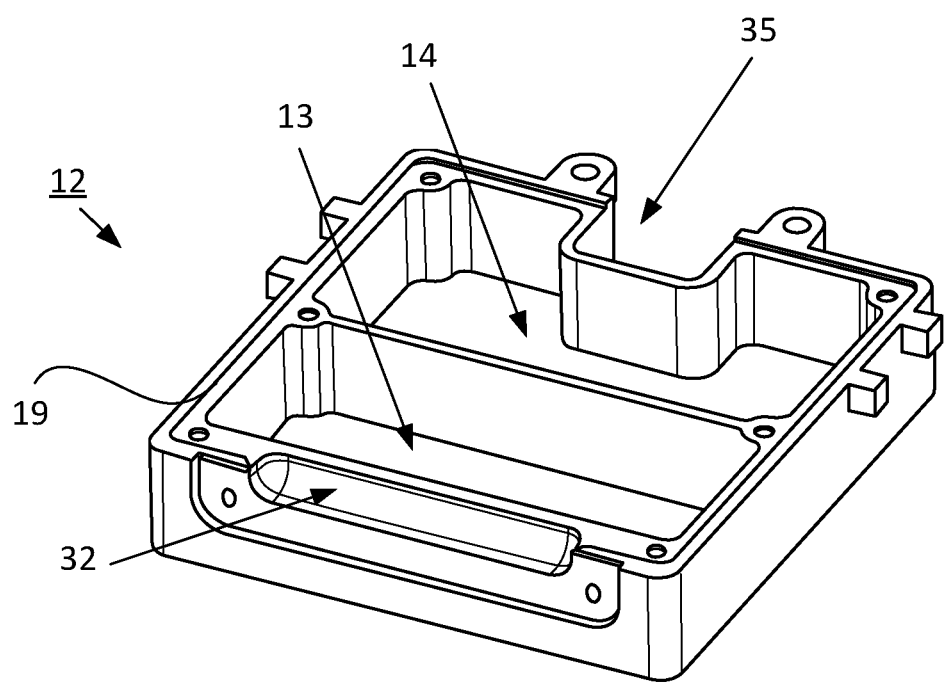
FIG. 3 illustrates a structural part of a first example embodiment of a wireless communication device.

FIG. 3 illustrates a structural part 12 of a first example embodiment of a wireless communication device 10b. FIG. 3 shows a 3D view of one of the "cavity half's" for the "wide antenna solutions described in connection with FIG. 2. From top right to bottom left, cavities for connectors 35, Baseband cavity 14 for Digital and DC/DC, radio cavity 13 and half of the antenna cavity 32 for the "wide antenna solution" can be identified. The structural part 11 further comprises a recess 19 for receiving and securing a PCB, such as disclosed in FIGS. 4, to the structural part.

Figure 4:
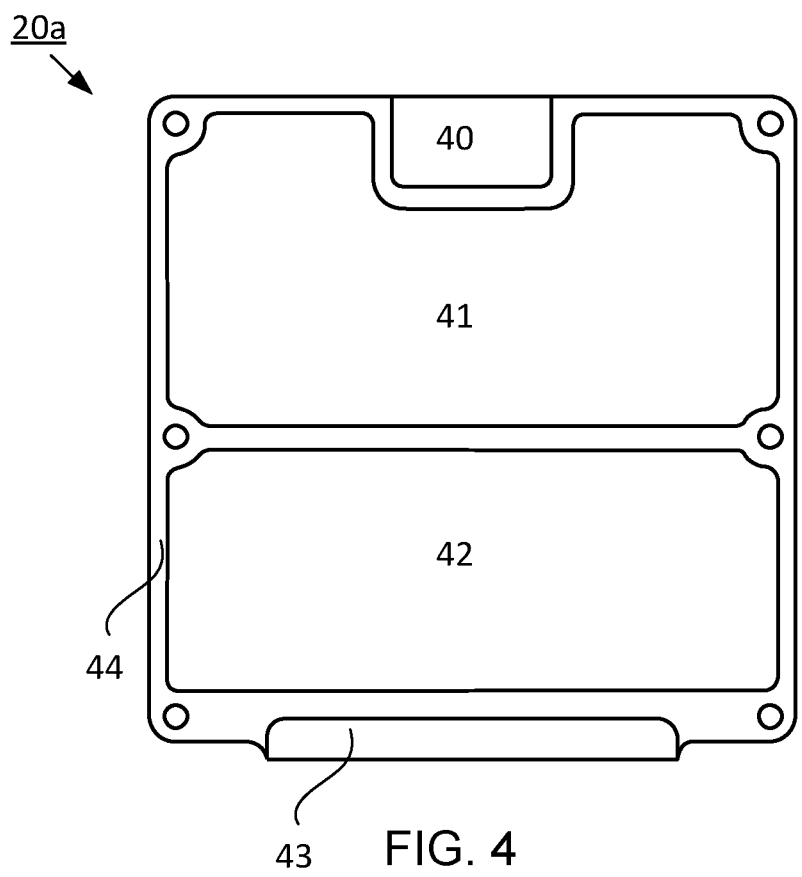
FIG. 4 illustrates a first example embodiment of a PCB configured to be used in the first example embodiment of the wireless communication device in FIG. 2.

FIG. 4 illustrates a first example embodiment of a PCB 20a configured to be used in the first example embodiment of the wireless communication device 10a in FIG. 2 having a "wide antenna solution". The PCB 20a comprises in this example a number of areas for different functionalities, an area for connectors 40, an area for digital and DC/DC solutions 41, an area for RF circuitry 42 and an area for the antenna solution 43. An area 44 is provided around all other areas (which may be grounded), and is configured to be in contact with the first and second structural part when mounted together. The PCB is normally a multilayered PCB with one or more internal conductive layers, and each of the antenna elements included in the example embodiment of this disclosure is integrated in one of the internal conductive layers.

Figure 5:
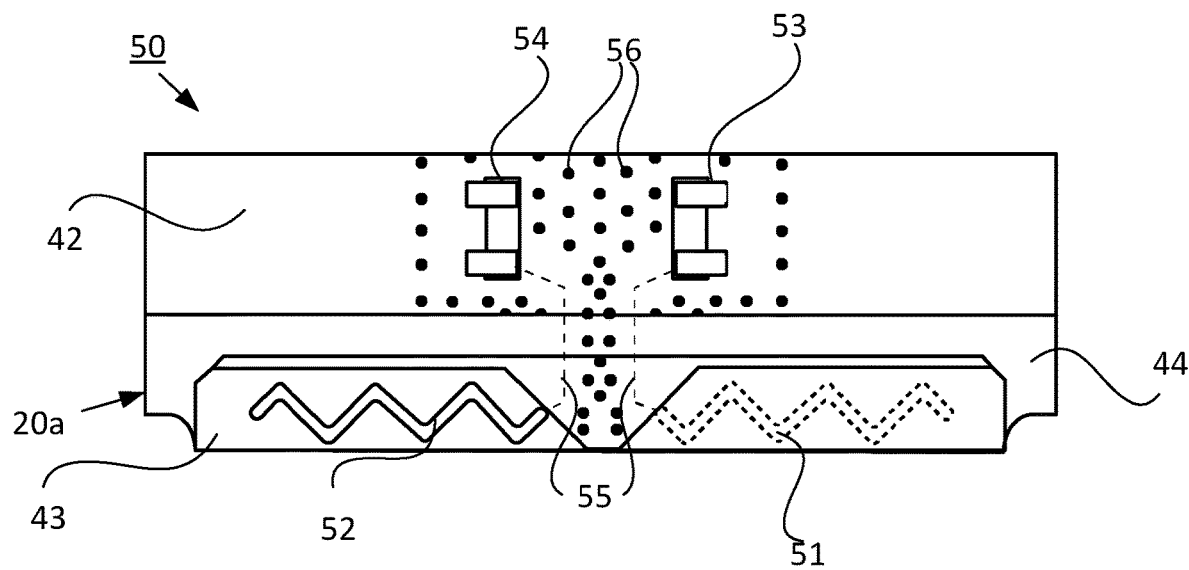
FIG. 5 illustrates a first antenna configuration with dual antenna elements embedded in the PCB of FIG. 4.

FIG. 5 illustrates a section of the PCB 20a of FIG. 4 having a first antenna configuration 50 with dual antenna elements 51, 52 which are electrically insulated from each other and embedded in the PCB. Any type of antenna element may be integrated within the PCB 20a, and in this embodiment each of the antenna element is a zig-zag shaped antenna. The area for RF circuitry 42 is provided with some components for passive adaptation networks 53 and 54, each being connected via an antenna wire as indicated by dashed lines 55 to each respective antenna element 51 and 52. Each antenna wire may be implemented as striplines within the PCB. Via holes 56 are provided to create a connection between ground planes within the PCB, as described in more detail in connection with FIGS. 10a and 10b.

The PCB 20a is arranged in a plane with antenna elements 51 and 52 laterally arranged within the PCB, parallel to the plane. The PCB 20a further comprises multiple conductive layers, e.g. twenty layers and the antenna elements 51 and 52 may be arranged side-by-side in the same conductive layer, e.g. one of the center layers. In an alternative embodiment, the antenna elements 51 and 52 are arranged in different conductive layers with an intermediate ground plane to further improve antenna characteristics. For instance, the first antenna element 51 may be arranged in conductive layer ten and the second antenna element may be arranged in conductive layer twelve, while conductive layers nine, eleven and thirteen are ground planes.

Figure 6:
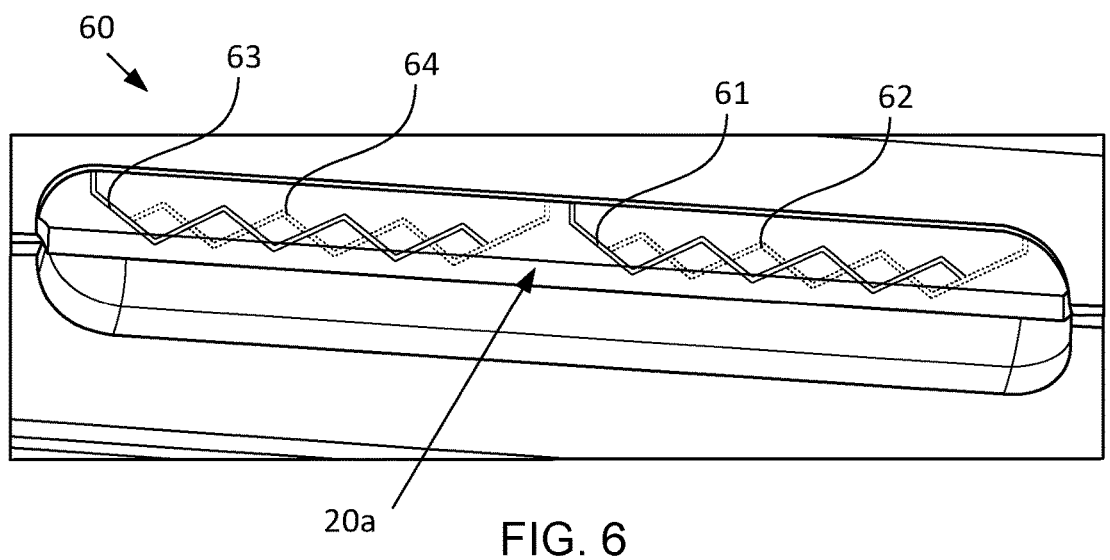
FIG. 6 illustrates a second antenna configuration with four antenna elements embedded in the PCB of FIG. 4 when mounted in the first example embodiment of the wireless communication device in FIG. 2.

FIG. 6 illustrates a second antenna configuration 60 with four antenna elements embedded in the PCB 20a of FIG. 4 when mounted in the first example embodiment of the wireless communication device in FIG. 2 (wide antenna solution). In this configuration, a first antenna element 61 and a second antenna elements 62 are laterally arranged to a third antenna element 63 and a fourth antenna elements 64, i.e. side by side and parallel to the plane of the PCB 20a. The first and second antenna elements 61, 62 are arranged to at least partially overlap each other in a normal direction of the plane of the PCB 20a and a conductive pattern of the first antenna element 61 is a mirror image of a conductive pattern of the second antenna element 62. The third and fourth antenna elements 63, 64 are also arranged to at least partially overlap each other in a normal direction of the plane of the PCB 20a and a conductive pattern of the third antenna element 63 is a mirror image of a conductive pattern of the fourth antenna element 64. By using a mirror image, the performance of a zig-zag shape of the antenna elements is improved which will reduce cross-talk and/or interference between the antenna elements.

In this embodiment, the conducting pattern of the two overlapping antenna elements always cross each other at a 90 degree angle in order to minimize crosstalk and/or interference between the antenna elements.

Figure 7:
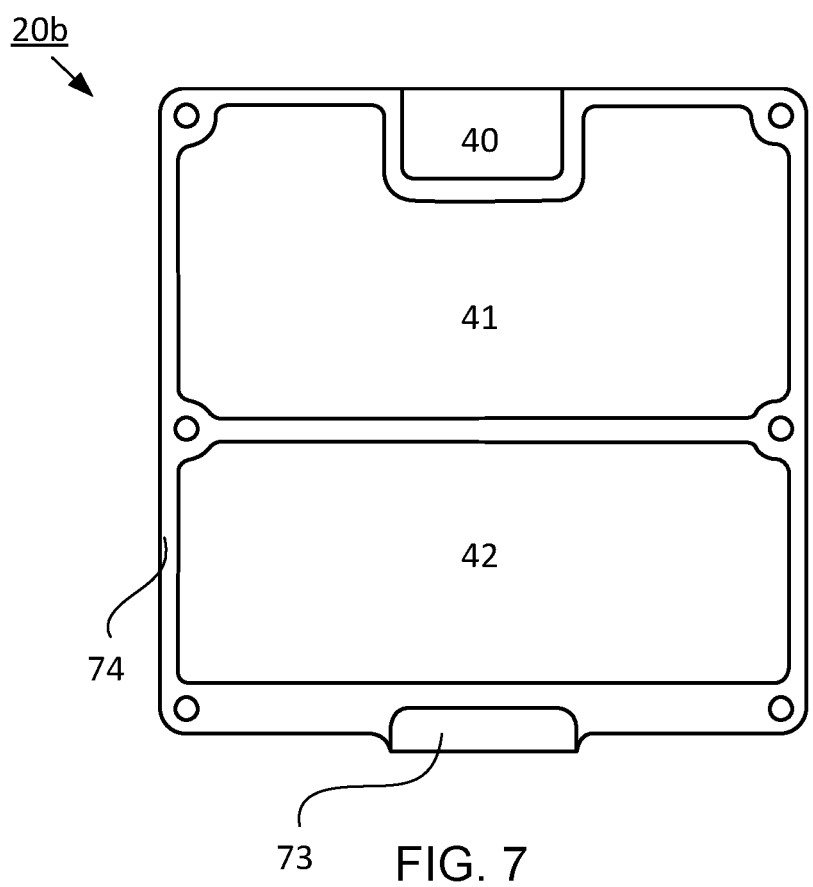
FIG. 7 illustrates a second example embodiment of a PCB configured to be used in the second example embodiment of the wireless communication device in FIG. 2.

FIG. 7 illustrates a second example embodiment of a PCB 20b configured to be used in the second example embodiment of the wireless communication device 10b in FIG. 2 having a "narrow antenna solution". The PCB 20b comprises in this example a number of areas for different functionalities, the area for connectors 40, the area for digital and DC/DC solutions 41, the area for RF circuitry 42 and an area for the antenna solution 73. An area 74 is provided around all other areas (which may be grounded), and is configured to be in contact with the first and second structural part when mounted together.

Figure 8:
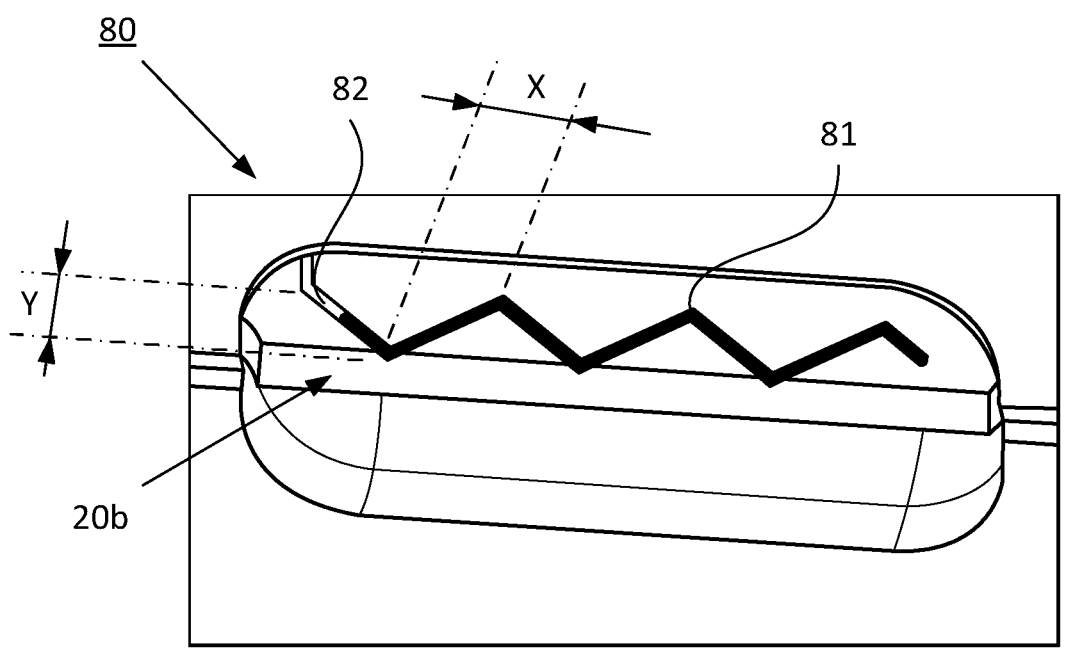
FIG. 8 illustrates a first antenna configuration with a single antenna element embedded in the PCB of FIG. 7.

FIG. 8 illustrates a first antenna configuration 80 with a single antenna element 81 embedded in the PCB 20b of FIG. 7 and an antenna wire 82 for connection to RF circuitry (not shown). FIG. 8 also shows the principle of an example antenna implementation valid for both the "wide antenna solution" and the "narrow antenna solution". The functionality of the antenna is as follows: The 802.11 standard provides several distinct radio frequency ranges for use in Wi-Fi communications: 900 MHz, 2.4 GHz, 3.6 GHz, 4.9 GHz, 5 GHz, 5.9 GHz and 60 GHz bands. However, in this example a standard Wi-Fi solution is considered, wherein the preferred frequencies used are 2.4 and 5 GHz which means that according to $c=\lambda \times f$, where c represents the speed of light in vacuum, λ represents the wavelength and f represents the frequency, the wavelength is $\lambda=c/f$ which gives:

$$\lambda(2.4 \text{ GHz})=0.125 \text{ m and}$$

$$\lambda(5.0 \text{ GHz})=0.060 \text{ m}$$

In order to create an antenna element that can provide functionality for both frequency bands an antenna is required which is suited for transmitting λ/2 frequencies as well as λ/4 frequencies. In short this means the antenna used can operate as a λ/4 antenna for the 2.4 GHz band and as a half wave antenna for the 5 GHz band since 0.125 m/4=31.5 mm whereas 0.060/2=30.0 mm. From a practical point of view this means that an antenna which suits its purpose shall have a length of approximately 30-32 mm to cover the sub frequency bands, e.g. frequency channels, included in 2.4 GHz and 5 Ghz.

This type of antenna element may be implemented in all example embodiments described in the disclosure, either as a single antenna element; or laterally and/or overlappingly arranged multiple antenna elements. Each antenna element is configured to transmit and/or receive RF signals in at least two frequency channels, including but not limited to frequency channels in 2.4 GHz, 5 GHz and Bluetooth. Multiple antenna elements will provide MIMO functionality.

In this example, as indicated in FIG. 8, a slope represents 3.6 mm in X and Y-direction. Since the angle of the slope is 45 degrees the total length of each slope is $\sqrt{2} \times 3.6 = 5.09$ mm. Furthermore, from picture above 5 full slopes and 2 half slopes can be identified, hence resulting in 6 full slopes providing a grand total of 5.09×6=30.547 mm This means that the required board space equals: $30.547$ mm/$\sqrt{2}$=21.6 in the X-direction whereas the required space in the Y-direction is approximately 3.6 mm.

The illustrated zig-zag shaped antenna element have an advantage compared to meander antennas when multiple antennas are arranged to partially overlap each other, since cross-talk and/or interference between the antenna elements is reduced.

Figure 9A:
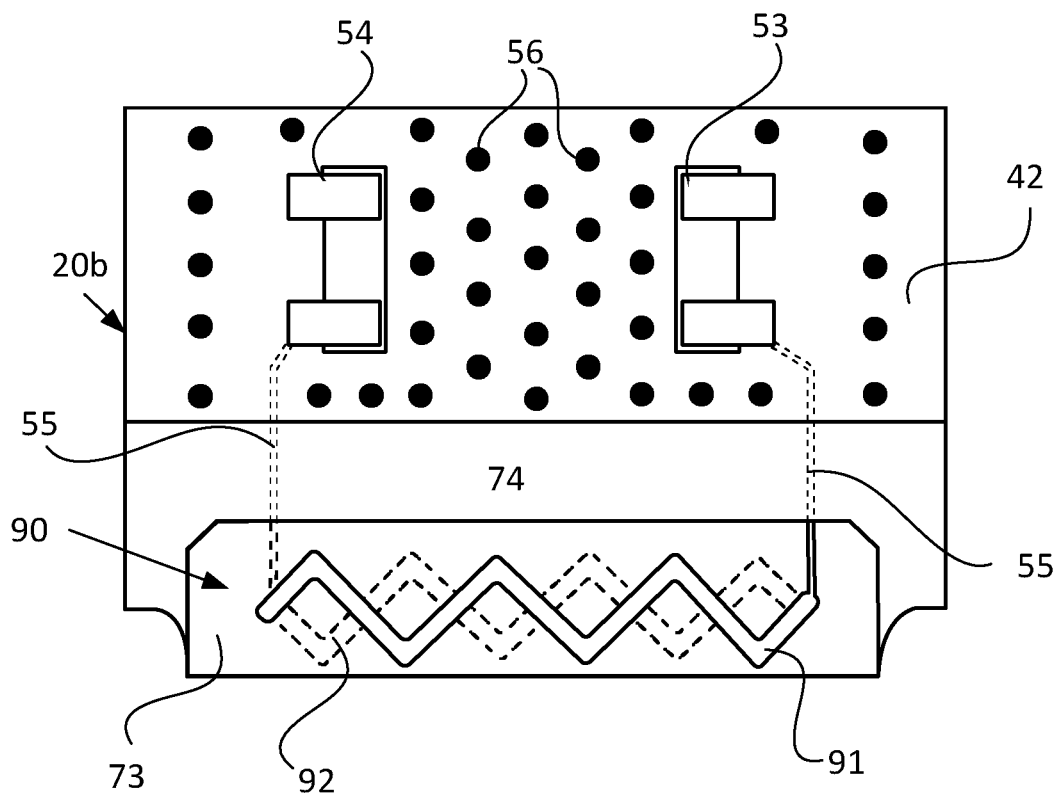
FIG. 9a illustrates a second antenna configuration with dual antenna elements embedded in the PCB of FIG. 7.

FIG. 9a illustrates a second antenna configuration 90 with dual antenna elements 91 and 92 embedded in the PCB 20b of FIG. 7. The area for RF circuitry 42 is provided with some components for passive adaptation networks 53 and 54, each being connected via an antenna wire as indicated by dashed lines 55 to each respective antenna element 91 and 92. Each antenna wire 55 may be implemented as striplines within the PCB. Via holes 56 are provided to create a connection between ground planes within the PCB, as described in more detail in connection with FIGS. 10a and 10b.

The PCB 20b is arranged in a plane a first antenna element 91 and a second antenna element 92 are arranged to at least partially overlap each other in a normal direction of the plane of the PCB and wherein a conductive pattern of the first antenna element 91 is a mirror image of a conductive pattern of the second antenna element 92. Thus, the antenna elements 91 and 92 are arranged on-top of each other but in different conductive layers of the PCB 20b. By using a mirror image, the performance of the zig-zag shape of the antenna elements is improved which will reduce cross-talk and/or interference between the antenna elements.

The PCB 20b further comprises multiple conductive layers, e.g. twenty layers and the antenna elements 91 and 92 are arranged in different internal conductive layers with an intermediate ground plane to further improve antenna characteristics. For instance, in a twenty layered PCB the first antenna element 91 may be arranged in conductive layer ten and the second antenna element may be arranged in conductive layer twelve, while conductive layers nine, eleven and thirteen are ground planes.

Figure 9B:
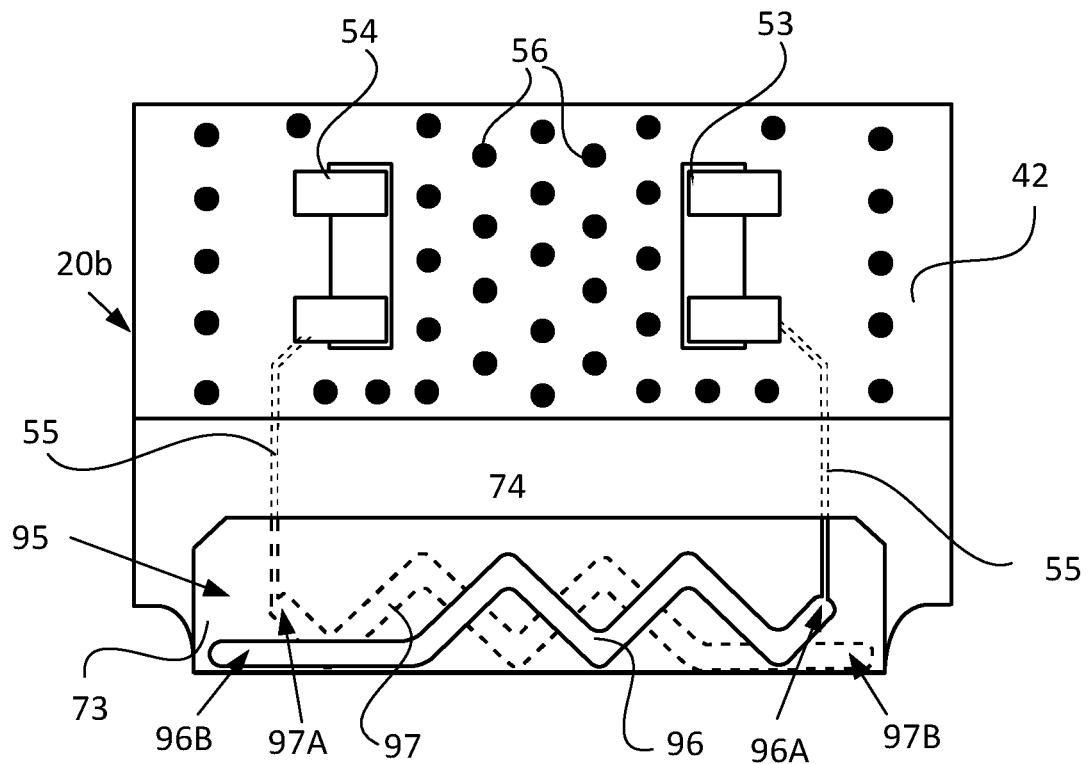
FIG. 9b illustrates a third antenna configuration with dual antenna elements embedded in the PCB of FIG. 7.

FIG. 9b illustrates a third antenna configuration 95 with dual antenna elements implemented with partial zig-zag conductive patterns 96, 97 embedded in the PCB 20b of FIG. 7. The area for RF circuitry 42 is provided with some components for passive adaptation networks 53 and 54, each being connected via an antenna wire as indicated by dashed lines 55 to each respective antenna element 96 and 97. Each antenna wire 55 may be implemented as striplines within the PCB. Via holes 56 are provided to create a connection between ground planes within the PCB, as described in more detail in connection with FIGS. 10a and 10b.

The PCB 20b is arranged in a plane a first antenna element 91 and a second antenna element 92 are arranged to at least partially overlap each other in a normal direction of the plane of the PCB and wherein a conductive pattern of the first antenna element 96 is a mirror image of a conductive pattern of the second antenna element 97. Thus, the antenna elements 96 and 97 are arranged on-top of each other but in different conductive layers of the PCB 20b. Each antenna element has a connection end 96A and 97A, respectively, which is connected to each antenna wire 55, and a free end 96B and 97B, respectively. In this embodiment, the free end 96B and 97B of each antenna element is parallel with the edge of the PCB to create a distance to adjacent ground planes surrounding each antenna wire as they are implemented as a stripline. By using a mirror image, the performance of the zig-zag shape of the antenna elements is improved which will reduce cross-talk and/or interference between the antenna elements.

The PCB 20b further comprises multiple conductive layers, e.g. twenty layers and the antenna elements 91 and 92 are arranged in different internal conductive layers with an intermediate ground plane to further improve antenna characteristics. For instance, in a twenty layered PCB the first antenna element 91 may be arranged in conductive layer ten and the second antenna element may be arranged in conductive layer twelve, while conductive layers nine, eleven and thirteen are ground planes.

Figure 10A:
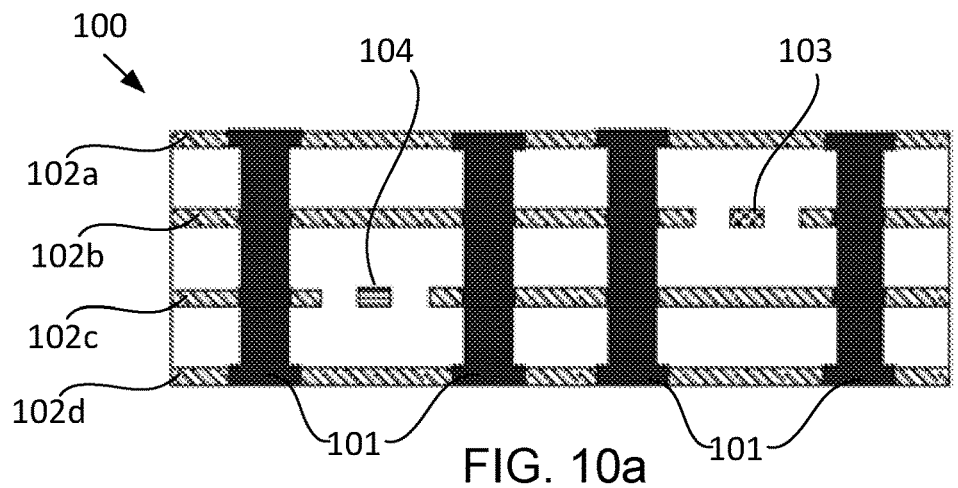
FIGS. 10a and 10b illustrate stripline connection between each antenna element and RF circuitry arranged on the PCB.
Figure 10B:
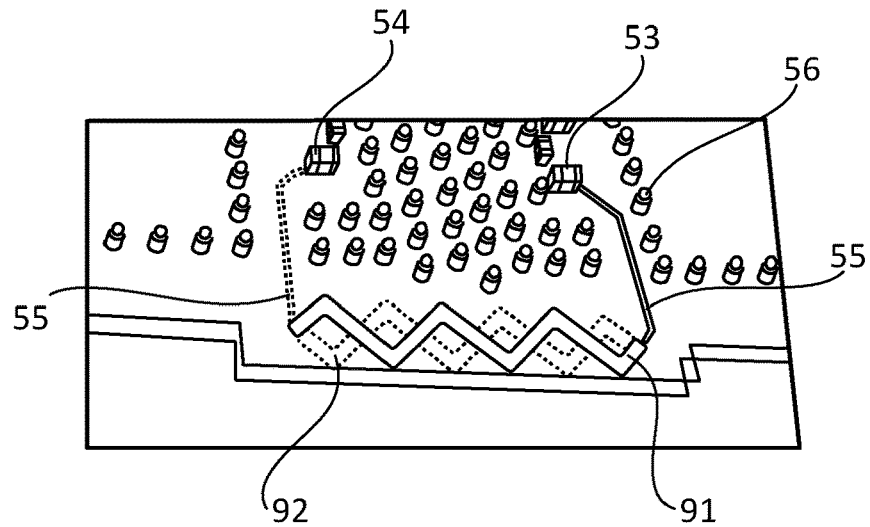

FIGS. 10a and 10b illustrate stripline connections between each antenna element and RF circuitry arranged on the PCB 20. FIG. 10a is a simplified cross-sectional view of a 4-layered PCB 100 provided with four via holes 101 interconnecting the conductive layers 102a-102d which in this example are ground planes. A first microstrips 103 is arranged in the second conductive layer 102b, and a second microstrip 104 is arranged in the third conductive layer 102c. Each microstrip 103, 104 is surrounded by adjacent ground planes and via holes 101 to create stripline connection between the antenna elements and the RF circuitry within the PCB.

The principle illustrated in FIG. 10a is used in FIG. 10b based on the second antenna configuration 90 with dual antenna elements 91 and 92 embedded in the PCB 20b illustrated in FIG. 9a. The ground planes are removed from FIG. 10b while the via holes 56 are maintained to clearly illustrate how striplines are used to interconnect antenna elements 91 and 92 with RF circuitry 53 and 54. The solid outlined antenna element 91 is arranged in a conductive layer with ground planes arrange above and beneath the antenna wire 55 to create the stripline connection from the antenna element 91 to the RF circuitry 53. The dashed outlined antenna element 92 is similarly arranged in a different conductive layer than the solid antenna element 91.

Figure 11:
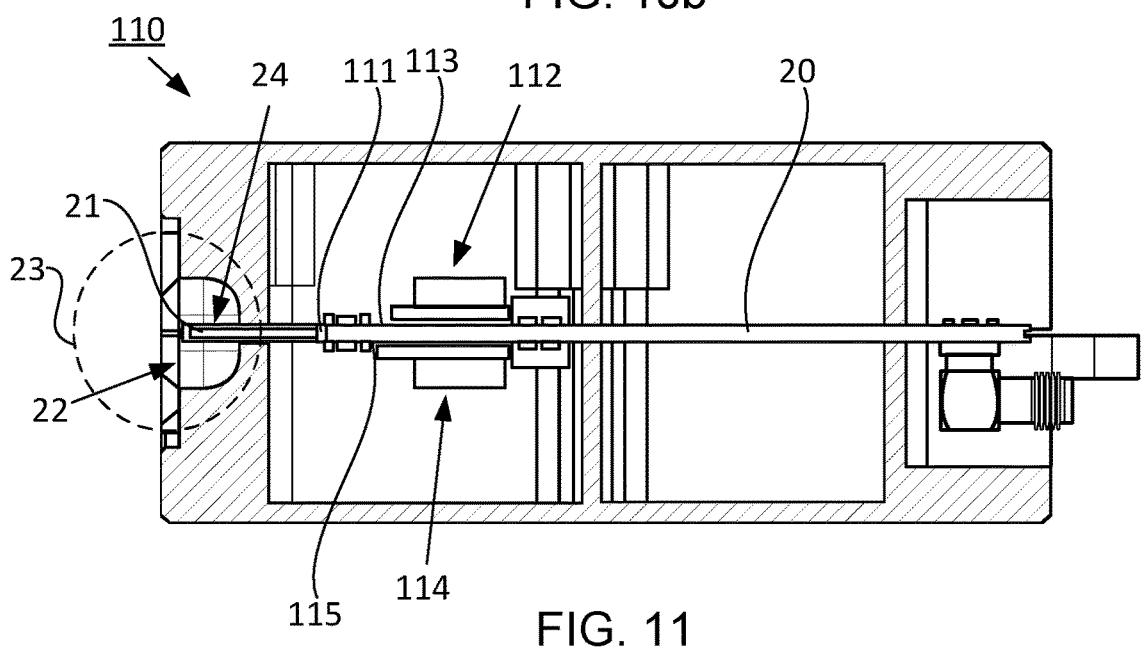
FIG. 11 is a cross-sectional view of a wireless communication device with RF circuitry mounted to the PCB and connected to an embedded antenna element.

FIG. 11 is a cross-sectional view of a wireless communication device 110 with RF circuitry mounted to the PCB 20 and connected to an antenna arrangement 23 with one or more embedded antenna elements 21. An antenna cavity 22 created in the mechanical structure around the exposed part 24 of the PCB 20.

In order to provide a "Two Vendor Solution" of modules or multiple discrete solutions, a first solution 112 may be mounted on the top side 113 of the PCB 20 and a second solution 114 can be assembled on the bottom side 115 of the PCB 20. However it is fully possible to use the same antenna configuration 23 since only one of the solutions is assembled at the time. The only common denominator is the common via-hole 111 from which the at least one antenna element is routed inside the PCB 20. Regardless of the solution chosen, a counter cavity which might be empty needs to be created on the opposite side of the solution chosen.

Figure 12A:
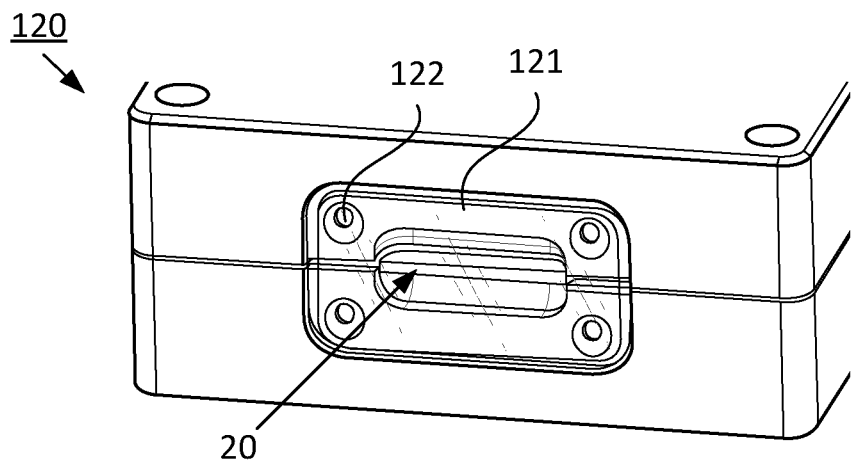
FIGS. 12a-12c illustrate alternative solutions to provide additional protection for the embedded antenna elements against a harsh environment.
Figure 12B:
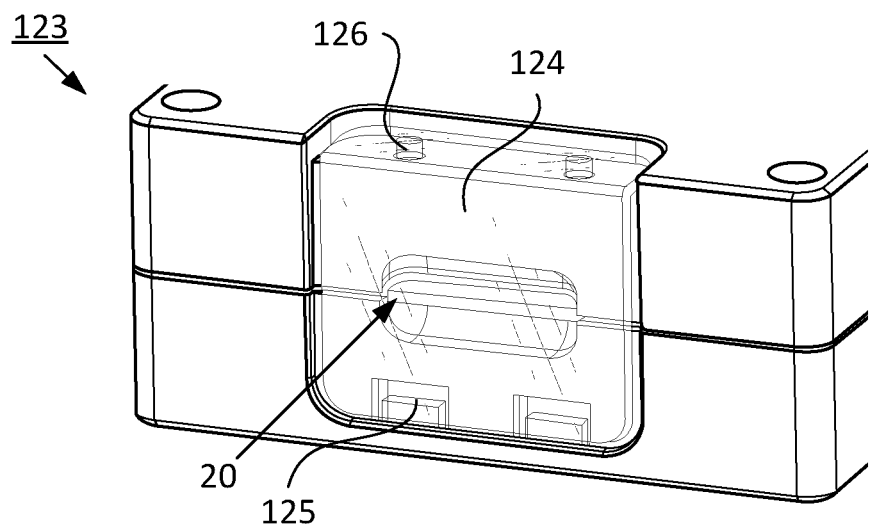
Figure 12C:
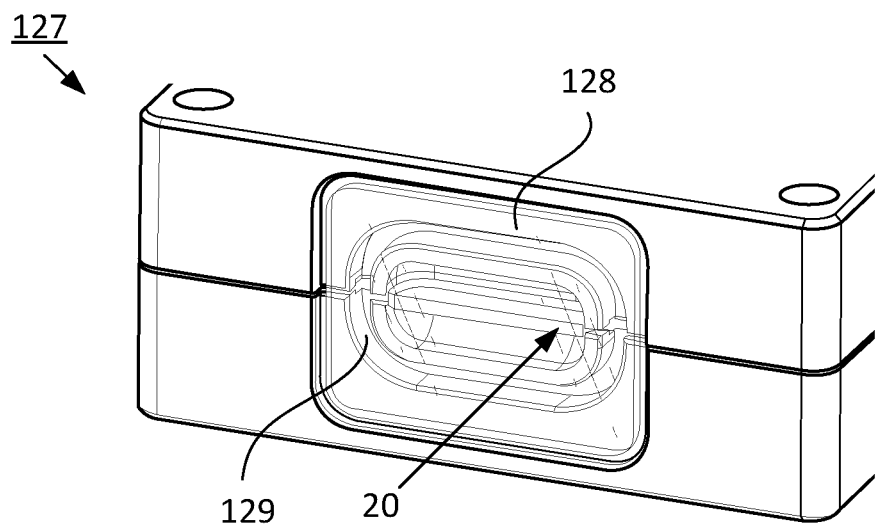

FIGS. 12a-12c illustrate alternative solutions to provide additional protection for the embedded antenna elements against a harsh environment, since the PCB 20 (containing at least one antenna element) is exposed via an opening or slot in the casing produced by the first and second part when mounted together.

FIG. 12a illustrates a first example of a communication device 120 with a first protective cover 121 which is attached to the first and second structural parts using screws 122. FIG. 12b illustrates a second example of a communication device 123 with a second protective cover 124 which is attached to the first and second structural parts using snap-in 125 and screws 126. FIG. 12c illustrates a third example of a communication device 127 with a third protective cover 128 which is attached to a grove 129 of the first and second structural parts using friction The protective covers 121, 124 and 128 are made from a non-conductive material and configured to allow radio signals to pass through.

Figure 13A:
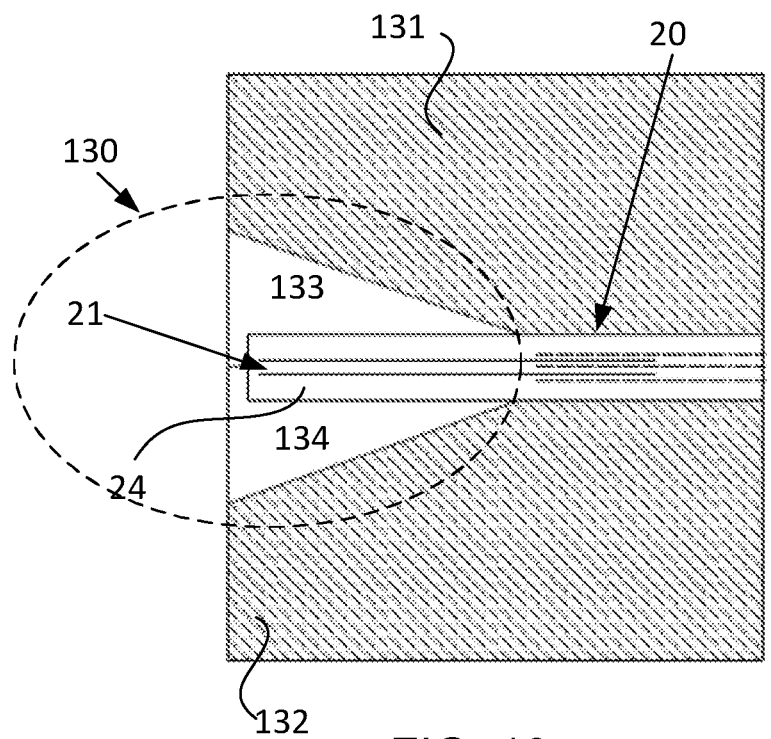
FIGS. 13a and 13b illustrate alternative antenna cavities of the antenna arrangement.
Figure 13B:
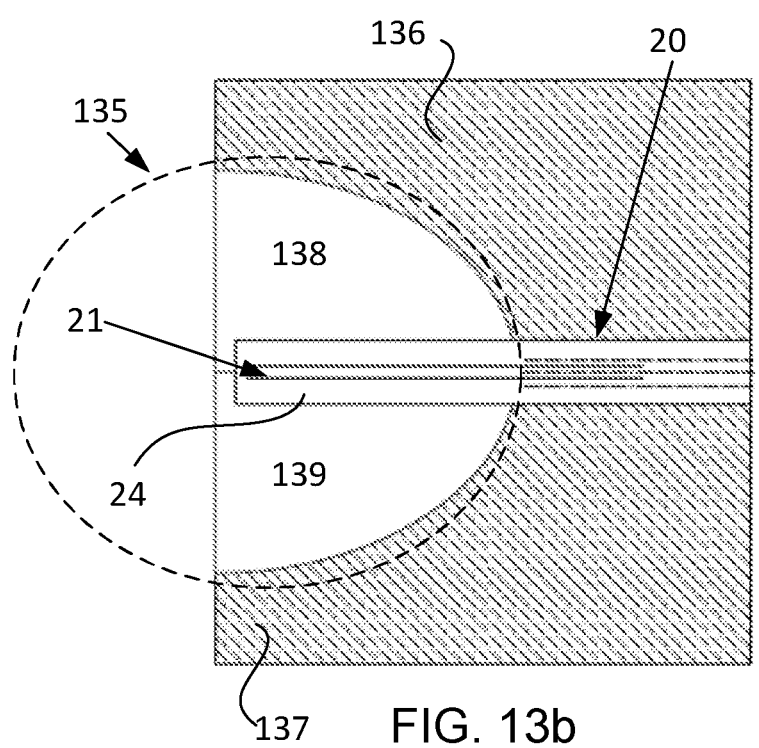

FIGS. 13a and 13b illustrate alternative antenna cavities of the antenna arrangement. A recess having a predetermined cross-sectional profile will ensure that the exposed part of the PCB 24, which in this example comprises two antenna elements 21 is exposed without extending beyond the structural parts, thereby reducing the risk for the PCB 20 to be damaged.

In FIG. 13a, the first antenna arrangement comprises a V-shaped cross-sectional profile. A first recess 133 is provided in the first structural part 131 and a second recess 134 is provided in the second structural part 132. A width of each recess 133, 134 is narrowest at a bottom of each recess, and is provided with an inclining cross-sectional profile from the bottom of each recess to the surface of each structural part 131, 132.

In FIG. 13b, the second antenna arrangement comprises a parabolic-shaped cross-sectional profile. A first recess 138 is provided in the first structural part 136 and a second recess 139 is provided in the second structural part 137. A width of each recess 138, 139 is narrowest at a bottom of each recess, and is provided with a parabolic cross-sectional profile from the bottom of each recess to the surface of each structural part 136, 137.

Figure 14:
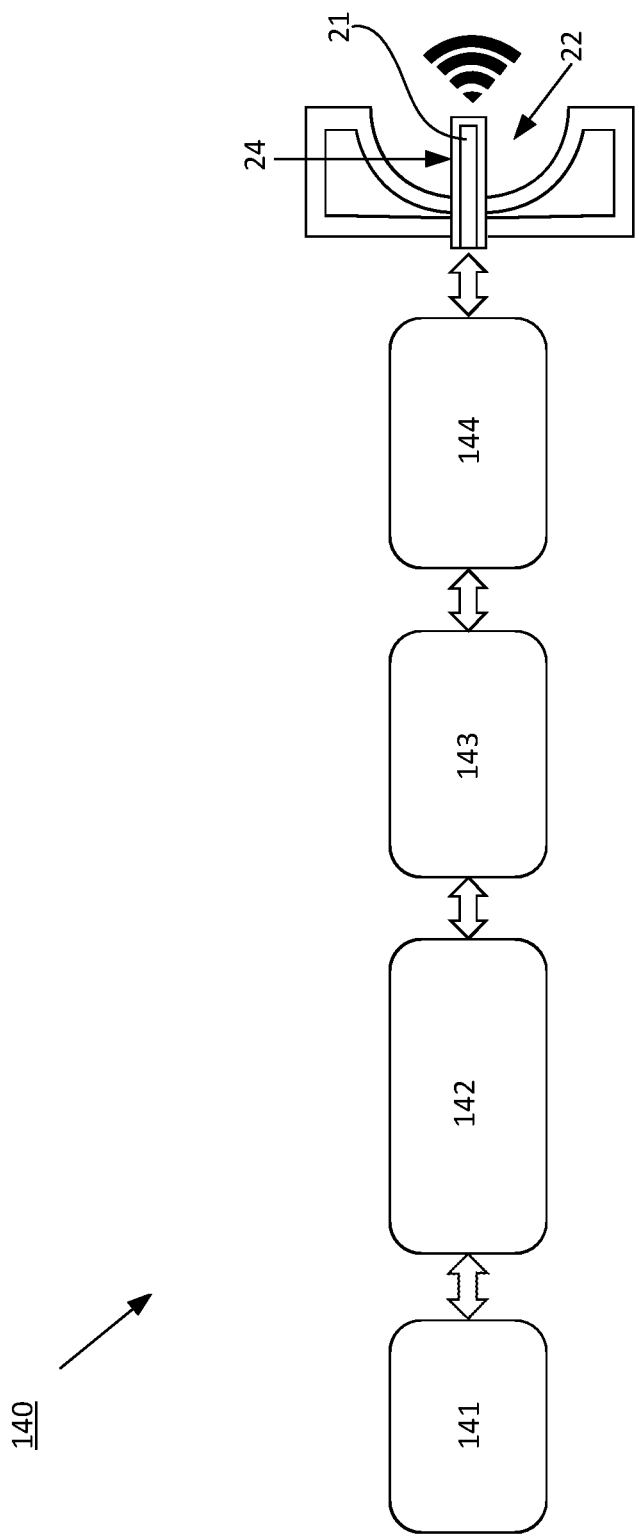
FIG. 14 schematically illustrates an RF chain with an antenna arrangement.

The first and second recess provide a symmetrical indentations around the antenna elements 21 to provide the directed antenna lobe. The cross-sectional profile of the indentation could be parabolic, V-shaped, stepped, etc. as long as the indentation is widest at the surface of the structural parts FIG. 14 schematically illustrates an RF chain 140 with an antenna arrangement 23 which may be implemented in a communication device as exemplified in connection with FIGS. 1 and 2. The RF chain 140 is divided into a number of blocks comprising:

Analog/Digital pre-stage 141 which is part of the functionality associated with the baseband cavity 14 (see FIG. 1), RF components 142, which may be discrete or modularized radio solutions, Filter adaptation network 143 normally of discrete components, Stripline RF distribution 144 which interconnects the at least one antenna element 21 in the antenna arrangement 23 with RF components 142 via the filter adaptation network 143.

The RF components 142, filter adaptation network 143 and stripline RF distribution are normally shielded, either by an RF cavity 13 (see FIG. 1) or if the modularized radio solution is shielded, no RF cavity s required. It should be noted that the RF components 142 are normally, but not necessarily, arranged on the same PCB provided with the embedded at least one antenna elements 21.

The antenna arrangement 23 is provided with an antenna cavity 22, which may be created by including recesses in the structural parts that form the casing of the communication device, and the exposed part 24 of the PCB is arranged within the antenna cavity 22. The at least one antenna element 21 is embedded inside the PCB, and integrated in one of the internal layers of the PCB.

It should be noted that the antenna elements in the example embodiments are embedded in close vicinity to an edge of the PCB. Furthermore, the word "embedded" has a purpose of defining that the antenna elements are protected against the environment and when mounted in a communication device, no connection holes in the casing is needed.

The present disclosure relates to a printed circuit board, PCB, with at least one integrated antenna element configured to transmit and/or receive radio frequency, RF, signals. Each of the at least one antenna element is configured to be connected to RF circuitry, and the at least one antenna element is embedded in the PCB.

According to some embodiments, the PCB is a multilayered PCB with one or more internal conductive layers, and each of the at least one antenna elements is integrated in one of the internal conductive layers.

According to some embodiments, the RF circuitry is mounted on the PCB.

According to some embodiments, each of the at least one antenna element is connected to the RF circuitry via a shielded stripline.

According to some embodiments, each of the at least one antenna element is at least partially a zig-zag shaped antenna.

According to some embodiments, the printed circuit board comprises at least two antenna elements, which are electrically insulated from each other, and which are embedded in the PCB.

According to some embodiments, the at least two antenna elements are laterally arranged in the PCB.

According to some embodiments, the PCB is arranged in a plane and a first antenna element and a second antenna element of the at least two antenna elements are arranged to at least partially overlap each other in a normal direction of the plane of the PCB and a conductive pattern of the first antenna element is a mirror image of a conductive pattern of the second antenna element.

According to some embodiments, the conductive pattern of first antenna element and the conductive pattern of the second antenna element cross each other in the normal direction at an angle of 90 degrees to reduce crosstalk and/or interference between the first and the second antenna elements.

According to some embodiments, each antenna element is configured to transmit and/or receive RF signals in at least two frequency channels.

The present disclosure further relates to an antenna arrangement for wireless communication configured to transmit and/or receive radio frequency, RF, signals. The antenna arrangement comprises: the printed circuit board, PCB, according to any of the embodiments described above, a first structural part, and a second structural part. A first side of the PCB is mounted to the first structural part and a second side, opposite to the first side, of the PCB is mounted to the second structural part to expose a part of the PCB with the at least one antenna element.

According to some embodiments, the first structural part and the second structural part are provided with a respective first recess and second recess adjacently arranged to the at least one antenna element.

According to some embodiments, each recess extends from a surface of each structural part to a predetermined depth, and wherein a width of each recess is widest at the surface of each structural part to provide a directed antenna lobe from the at least one antenna element.

According to some embodiments, the width of each recess is narrowest at a bottom of the recess, to provide an inclining cross-sectional profile from the bottom of the recess to the surface of each structural part.

According to some embodiments, a non-conductive protective cover is provided over the exposed part of the PCB.

The present disclosure further relates to a communication device for wireless communication comprising RF circuitry configured to transmit and/or receive radio frequency, RF, signals, and the antenna arrangement according to any embodiment described above. The first structural part and the second structural part are configured to form a casing having at least a first cavity. The RF circuitry is configured to be arranged within the first cavity and electrically connected to the at least one antenna element embedded in the PCB.

In some implementations and according to some aspects of the disclosure, the functions or steps noted in the blocks can occur out of the order noted in the operational illustrations. For example, two blocks shown in succession can in fact be executed substantially concurrently or the blocks can sometimes be executed in the reverse order, depending upon the functionality/acts involved. Also, the functions or steps noted in the blocks can according to some aspects of the disclosure be executed continuously in a loop.

In the drawings and specification, there have been disclosed exemplary aspects of the disclosure. However, many variations and modifications can be made to these aspects without substantially departing from the principles of the present disclosure. Thus, the disclosure should be regarded as illustrative rather than restrictive, and not as being limited to the particular aspects discussed above. Accordingly, although specific terms are employed, they are used in a generic and descriptive sense only and not for purposes of limitation.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products. It should be appreciated that the example embodiments presented herein may be practiced in any combination with each other.

It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

A "wireless device" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc. Furthermore, a device may be interpreted as any number of antennas or antenna elements.

Although the description is mainly given for a user equipment, as measuring or recording unit, it should be understood by the skilled in the art that "user equipment" is a non-limiting term which means any wireless device, terminal, or node capable of receiving in DL and transmitting in UL (e.g. PDA, laptop, mobile, sensor, fixed relay, mobile relay or even a radio base station, e.g. femto base station).

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A printed circuit board, PCB, with at least one integrated antenna element configured to transmit and/or receive radio frequency, RF, signals, each of the at least one antenna element being configured to be connected to RF circuitry, and the at least one antenna element being embedded in the PCB, the PCB comprising at least two antenna elements, which are electrically insulated from each other, and which are embedded in the PCB, the PCB being arranged in a plane, and a first antenna element and a second antenna element of the at least two antenna elements being arranged to at least partially overlap each other in a normal direction of the plane of the PCB, and a conductive pattern of the first antenna element being a mirror image of a conductive pattern of the second antenna element.

2. The printed circuit board according to claim 1, wherein the PCB is a multilayered PCB with one or more internal conductive layers, and each of the at least one antenna elements is integrated in one of the internal conductive layers.

3. The printed circuit board according to claim 1, wherein the RF circuitry is mounted on the PCB.

4. The printed circuit board according to claim 3, wherein each of the at least one antenna element is connected to the RF circuitry via a shielded stripline.

5. The printed circuit board according to claim 1, wherein each of the at least one antenna element is at least partially a zig-zag shaped antenna.

6. The printed circuit board according to claim 1, wherein the at least two antenna elements are laterally arranged in the PCB.

7. The printed circuit board according to claim 1, wherein the conductive pattern of first antenna element and the conductive pattern of the second antenna element cross each other in the normal direction at an angle of 90 degrees to reduce crosstalk and/or interference between the first antenna element and the second antenna elements.

8. The printed circuit board according to claim 1, wherein each antenna element is configured to transmit and/or receive RF signals in at least two frequency channels.

9. An antenna arrangement for wireless communication configured to transmit and/or receive radio frequency, RF, signals, the antenna arrangement comprising:
 a printed circuit board, PCB, with at least one integrated antenna element configured to transmit and/or receive radio frequency, RF, signals, each of the at least one antenna element being configured to be connected to RF circuitry, and the at least one antenna element being embedded in the PCB,
 a first structural part, and
 a second structural part,
 a first side of the PCB being mounted to the first structural part and a second side, opposite to the first side, of the PCB being mounted to the second structural part to expose a part of the PCB with the at least one antenna element, the first structural part and the second structural part being provided with a respective first recess and second recess adjacently arranged to the at least one antenna element.

10. The antenna arrangement according to claim 9, wherein each recess extends from a surface of each structural part to a predetermined depth, and wherein a width of each recess is widest at the surface of each structural part to provide a directed antenna lobe from the at least one antenna element.

11. The antenna arrangement according to claim 10, wherein the width of each recess is narrowest at a bottom of the recess, to provide an inclining cross-sectional profile from the bottom of the recess to the surface of each structural part.

12. The antenna arrangement according to claim 9, wherein a non-conductive protective cover is provided over the exposed part of the PCB.

13. A communication device for wireless communication comprising:
 RF circuitry configured to transmit and/or receive radio frequency, RF, signals, and
 an antenna arrangement for wireless communication configured to transmit and/or receive RF signals, the antenna arrangement comprising:
  a printed circuit board, PCB, with at least one integrated antenna element configured to transmit and/or receive RF signals, each of the at least one antenna element being configured to be connected to RF circuitry, and the at least one antenna element being embedded in the PCB, the PCB comprising at least two antenna elements, which are electrically insulated from each other, and which are embedded in the PCB, the PCB being arranged in a plane, and a first antenna element and a second antenna element of the at least two antenna elements being arranged to at least partially overlap each other in a normal direction of the plane of the PCB, and a conductive pattern of the first antenna element being a mirror image of a conductive pattern of the second antenna element,
  a first structural part, and
  a second structural part,
  a first side of the PCB being mounted to the first structural part and a second side, opposite to the first side, of the PCB being mounted to the second structural part to expose a part of the PCB with the at least one antenna element, the first structural part and the second structural part being provided with a respective first recess and second recess adjacently arranged to the at least one antenna element,
 the first structural part and the second structural part being configured to form a casing having at least a first cavity, and
 the RF circuitry being configured to be arranged within the first cavity and electrically connected to the at least one antenna element embedded in the PCB.

* * * * *